United States Patent
Perret et al.

(10) Patent No.: US 11,079,580 B2
(45) Date of Patent: Aug. 3, 2021

(54) EXPOSURE OPTICS AND DEVICE FOR PRODUCING A THREE-DIMENSIONAL OBJECT

(71) Applicant: EOS GmbH Electro Optical Systems, Krailling (DE)

(72) Inventors: Hans Perret, Munich (DE); Stephan Gronenborn, Aachen (DE)

(73) Assignee: EOS GmbH Electro Optical Systems, Krailling (DE)

( * ) Notice: Subject to any disclaimer, the term of this patent is extended or adjusted under 35 U.S.C. 154(b) by 250 days.

(21) Appl. No.: 15/771,261

(22) PCT Filed: Oct. 28, 2016

(86) PCT No.: PCT/EP2016/001798
§ 371 (c)(1),
(2) Date: Apr. 26, 2018

(87) PCT Pub. No.: WO2017/076493
PCT Pub. Date: May 11, 2017

(65) Prior Publication Data
US 2018/0314044 A1    Nov. 1, 2018

(30) Foreign Application Priority Data

Nov. 4, 2015   (DE) ............... 10 2015 221 623.3

(51) Int. Cl.
*G02B 13/00* (2006.01)
*G02B 19/00* (2006.01)
(Continued)

(52) U.S. Cl.
CPC .......... *G02B 19/0009* (2013.01); *B22F 12/00* (2021.01); *B29C 64/153* (2017.08);
(Continued)

(58) Field of Classification Search
CPC .. B22F 2003/1056; B22F 12/40; B22F 12/49; B29C 64/264; B29C 64/268;
(Continued)

(56) References Cited

U.S. PATENT DOCUMENTS 3,773,404 A  * 11/1973 Moore ................ G02B 13/22
                                                    359/663 X
6,147,816 A    11/2000 Ori
(Continued)

FOREIGN PATENT DOCUMENTS

CN    204263551 U    1/2014
CN    103513431 A    4/2015
(Continued)

OTHER PUBLICATIONS

Chinese Search Report for Application No. 201680064437 dated Mar. 27, 2020, 2 pages.
(Continued)

*Primary Examiner* — Leo B Tentoni
(74) *Attorney, Agent, or Firm* — Seyfarth Shaw LLP

(57) ABSTRACT

An exposure optics serves as an equipping and/or retrofitting optics for a device for producing a three-dimensional object by selectively solidifying building material, layer by layer. The exposure optics includes at least a first object-sided lens system having a first focal length $f_1$ and a second image-sided lens system having a second focal length $f_2$, which lens systems can be arranged in the beam path of the radiation emitted by the radiation source. The focal plane of the first lens system and the focal plane of the second lens system coincide in a plane between the two lens systems. The focal length $f_1$ of the first lens system is equal to or greater than the focal length $f_2$ of the second lens system. The exposure
(Continued)

optics is designed and can be arranged such that the electromagnetic radiation is incident substantially perpendicular on the working surface.

19 Claims, 6 Drawing Sheets

(51) Int. Cl.
    *B41J 2/45*           (2006.01)
    *G02B 13/22*         (2006.01)
    *G03F 7/20*           (2006.01)
    *B22F 12/00*         (2021.01)
    *B29C 64/264*        (2017.01)
    *B33Y 30/00*         (2015.01)
    *B29C 64/153*        (2017.01)
    *B29C 64/268*        (2017.01)
    *B22F 10/10*         (2021.01)
    *B22F 12/40*         (2021.01)
    *B22F 12/49*         (2021.01)
    *B33Y 10/00*         (2015.01)
    *B23K 26/06*         (2014.01)

(52) U.S. Cl.
    CPC .......... *B29C 64/264* (2017.08); *B29C 64/268* (2017.08); *B33Y 30/00* (2014.12); *B41J 2/451* (2013.01); *G02B 13/22* (2013.01); *G03F 7/2053* (2013.01); *G03F 7/2055* (2013.01); *G03F 7/70416* (2013.01); *B22F 10/10* (2021.01); *B22F 12/40* (2021.01); *B22F 12/49* (2021.01); *B23K 26/0665* (2013.01); *B33Y 10/00* (2014.12)

(58) Field of Classification Search
    CPC ....... B33Y 30/00; G02B 13/22; G03F 7/0037; G03F 7/70416

USPC ......... 425/174.4; 219/121.6, 121.65, 121.73, 219/121.75; 359/663

See application file for complete search history.

(56) References Cited

U.S. PATENT DOCUMENTS

| | | | |
|---|---|---|---|
| 2008/0165425 A1* | 7/2008 | Cayer | ...................... G02B 3/02 359/641 |
| 2009/0050611 A1* | 2/2009 | Sukhman | ............... B33Y 30/00 219/121.79 |
| 2009/0086307 A1 | 4/2009 | Meisburger | |
| 2012/0298886 A1 | 11/2012 | Petersen et al. | |
| 2013/0308199 A1 | 11/2013 | Shiue et al. | |

FOREIGN PATENT DOCUMENTS

| | | |
|---|---|---|
| EP | 0601485 | 6/1994 |
| JP | 2000089107 | 3/2000 |
| JP | 2000321528 | 11/2000 |
| JP | 2002033539 | 1/2002 |
| JP | 2002090634 | 3/2002 |
| JP | 2003215446 | 7/2003 |
| KR | 1020100130497 | 12/2010 |
| WO | 2005114643 | 12/2005 |
| WO | 2015091485 | 6/2015 |

OTHER PUBLICATIONS

International Search Report for Application No. PCT/EP2016/001798 dated Feb. 6, 2017, 3 pages.

Chinese Second Office Action for Application No. 201680064437.9 dated Sep. 30, 2020, 7 pages.

"3D Printing Technology Revised Edition" edited by Wang Yungan and Wang Xuan, Wuhan: Huazhong University of Science and Technology Press, Jul. 2014, pp. 1-14 (Chinese).

* cited by examiner (Stand der Technik)

EXPOSURE OPTICS AND DEVICE FOR PRODUCING A THREE-DIMENSIONAL OBJECT

TECHNICAL FIELD OF THE INVENTION

The present invention relates to an apparatus for producing a three-dimensional object by layer-wise applying and selectively solidifying a building material, in particular to an exposure optics comprised in the device.

BACKGROUND OF THE INVENTION

Devices of this type are used, for example, in rapid prototyping, rapid tooling or additive manufacturing. An example of such a method is known by the name "selective laser sintering or laser melting." In this method, a thin layer of a building material is repeatedly applied and the building material is selectively solidified in each layer by selective irradiation with a laser beam.

In order to accelerate the solidification process, the device known from WO 2015/091485 comprises semiconductor lasers that are grouped as laser arrays in modules and emit a planar laser radiation. By selectively extensively irradiating thin layers of a building material, which are applied to a build area, the building material is solidified at those positions that correspond to the cross-section of the object to be produced in the respective layer.

For imaging the laser radiation emitted by the modules, an optical device is provided that is arranged between the radiation source and the build area in which the solidification of the building material takes place. The optical device comprises a lens arranged above the build area for imaging the laser radiation onto the build area.

FIG. 7 shows the beam path of such a lens arrangement. Three laser elements L1-L3 of a laser array emit collimated radiation 101-103 in the form of beam cones towards the build area 104. These beam cones are focused by means of a lens 105 and produce image points B1-B3 in the build area, which image points are demagnified images of the laser elements L1-L3. Since the individual lasers of the arrays are to be imaged in a demagnified manner to the build area, the lens 105 is arranged considerably closer to the build area 104 than to the laser diodes L1-L3, which can result in a strongly inclined incidence of the beam at the edge regions with reduced energy input per area element. In addition, the accuracy of imaging depends on the distance of the radiation source to the build area.

SUMMARY OF THE INVENTION

It is an object of the present invention to provide an alternative or improved exposure optics for such a device. In particular, imaging of the beam cones emitted in a plane to a working surface is to be enabled with the smallest possible geometric aberrations.

This object is achieved by an exposure optics according to claim 1, a device according to claim 10 and the use of an exposure optics according to claim 15. Further developments of the invention are given in the respective dependent claims. The device can also be further developed by the features of the exposure optics given below and in the dependent claims or vice versa. This applies analogously to the corresponding inventive use.

The exposure optics according to the invention serves as an equipping and/or retrofitting optics for a device for producing a three-dimensional object by selectively solidifying building material, layer by layer, at positions that correspond to the cross-section of the object to be produced in the respective layer by means of electromagnetic radiation, wherein the device comprises a radiation source capable of emitting an electromagnetic radiation that is suited to cause solidification of the building material at positions of a layer of the building material applied in a working surface of the device, which positions correspond to the cross-section of the object to be produced, when impinging on those positions. The exposure optics comprises at least a first object-sided lens system having a first focal length $f_1$ and a second image-sided lens system having a second focal length $f_2$, which lens systems are arranged in the beam path of the radiation emitted by the radiation source. The focal plane of the first lens system and the focal plane of the second lens system coincide in a plane between the two lens systems and the focal length $f_1$ of the first lens system is equal to or greater than the focal length $f_2$ of the second lens system. The exposure optics is designed and can be arranged such that the electromagnetic radiation is incident on the working surface substantially perpendicular.

This bi-telecentric imaging allows to image the extensive radiation emitted by the radiation source to the working surface. As a result, it is possible to solidify the building material selectively at positions that correspond to the cross-section of the object in the respective layer quickly and in a simple way. Due to the bi-telecentric imaging the magnification or demagnification and thus the size of the irradiated area is mostly independent of the distance of the light source to the working surface. In addition, a low optical distortion is achieved, which allows for a lateral arrangement of several modules with associated optics. Since the laser radiation is incident substantially perpendicular on the working surface, it is ensured that the intensity distribution of the laser radiation is substantially uniform across the area to be irradiated.

Preferably, the second lens system comprises at least two curved surfaces, wherein at least one of them is aspheric and preferably concave. For example, the aspheric surface serves for correcting for geometric aberrations such as optical distortion or field curvature.

Preferably, the second lens system comprises at least two curved surfaces and the minimum distance and/or the center thickness between the two surfaces is greater than a quarter, preferably greater than half the focal length $f_2$. As a result, the principal plane of the second lens system is located close to that surface of the lens system that faces the working surface.

Preferably, the second lens system comprises at least two curved surfaces, wherein at least one of the curved surfaces is spherical and whose radius of curvature R applies:

$$R < f_2 \cdot (n-1)$$

wherein $f_2$ is the focal length of the second lens system and n is the refractive index of the lens material. As a result, the focal length of the spherical surface is smaller than the focal length of the second lens system as a whole.

The first lens system preferably comprises two spherical surfaces or a planar and a spherical surface. As a result, the parallel radiation emitted by the radiation source is collimated in a focal plane by the first lens system.

Preferably, the quotient $f_2/f_1$ corresponds to a selected magnification or demagnification scale. Thus, among other things, the size of the area to be irradiated and thus also the energy input per area element can be defined in a simple manner.

Preferably, the quotient $f_2/f_1$ has a value of at least 0.05, preferably of at least 0.1 and particularly preferred of at least 0.15 and/or of at most 1, preferably of at most 0.5 and particularly preferred of at most 0.3. The demagnified imaging results in a smaller pixel size and a higher energy input per area element.

Preferably, at least one, more preferably each, of the two lens systems is formed by a single lens. This facilitates insertion and alignment of the lenses in the device.

Alternatively, at least one of the lens systems can be composed of at least two lenses. In particular when using a lens system with two differently curved surfaces, the production of the lens system can be facilitated and differently curved surfaces can be combined as required.

The device according to the invention serves for producing a three-dimensional object by selectively solidifying building material, layer by layer, at positions that correspond to the cross-section of the object to be produced in the respective layer by means of electromagnetic radiation and comprises a radiation source capable of emitting electromagnetic radiation. Solidification of the building material takes place in a working surface and the device comprises an exposure optics having at least a first object-sided lens system with a first focal length $f_1$ and a second image-sided lens system with a second focal length $f_2$, which lens systems are arranged in the beam path of the radiation emitted by the radiation source. The focal plane of the first lens system and the focal plane of the second lens system coincide in a plane between the two lens systems, the focal length $f_1$ of the first lens system is equal to or greater than the focal length $f_2$ of the second lens system and the exposure optics is designed and can be arranged such that the electromagnetic radiation is incident substantially perpendicular on the working surface. As a result, the effects given above for the exposure optics can be achieved with a device for producing a three-dimensional object that comprises the exposure optics.

Preferably, the radiation source is formed by lasers, in particular VCSELs, which are grouped as modules, each module preferably comprising at least two laser arrays. By means of this arrangement, a radiation source for extensive irradiation can be realized. The use of VCSELs allows for quickly switching of the lasers. In addition to the well-known surface emitters (vertical-cavity surface-emitting lasers—VCSEL), the term VCSELs also refers to, among other things, VECSELs (optically pumped semiconductor lasers—vertical external cavity surface emitting lasers), analogously to the definition of WO 2015/091485, which definition also applies in the present application. In general, the disclosure of WO 2015/091485 is to be understood as part of the disclosure of the present application.

Preferably, the exposure optics is movably arranged in a process chamber of the device. Thus, the exposure optics can be moved across the working surface in accordance with a current solidification position.

Preferably, the focal length $f_2$ of the second lens system is smaller than a minimum free working distance. Thus, a distance is defined between the exposure optics and the working surface.

Preferably, the radiation source and/or a further exposure optics arranged between the radiation source and the exposure optics are configured such that the radiation is incident on the first lens system substantially perpendicular. By means of the telecentrically imaging, the laser beams reach the working surface as parallel beams with a constant spacing between the beam axes.

The use of an exposure optics according to the invention serves for producing a three-dimensional object in a device by means of selectively solidifying building material, layer by layer, at positions that correspond to the cross-section of the object to be produced in the respective layer by means of electromagnetic radiation, wherein the device comprises a radiation source capable of emitting electromagnetic radiation and wherein solidification of the building material takes place in a working surface. Thus, the effects given above for the exposure optics and the device can be achieved by the use of the exposure optics.

BRIEF DESCRIPTION OF THE DRAWINGS

Further features and expediencies of the invention are set out in the description of exemplary embodiments with reference to the attached drawings.

DETAILED DESCRIPTION OF THE EMBODIMENTS

Figure 1:
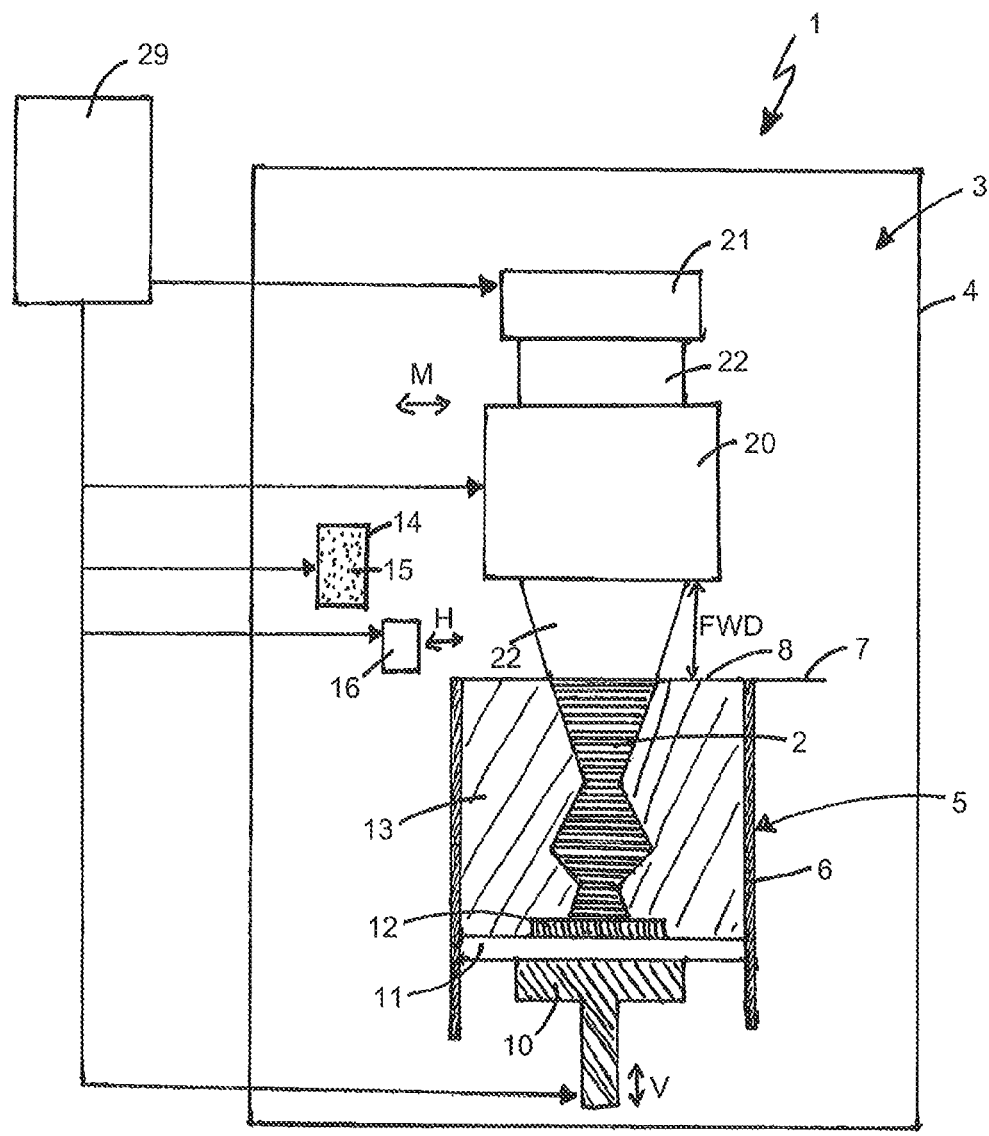
FIG. 1 shows a schematic view, partially in cross-section, of a device for layer-wise producing a three-dimensional object according to an embodiment of the present invention.

Hereafter, a device 1 according to an embodiment of the present invention is described with reference to FIG. 1. The device shown in FIG. 1 is a laser sintering device or laser melting device 1. For building an object 2, it comprises a process chamber 3 with a chamber wall 4.

A container 5 open to the top with a container wall 6 is arranged in the process chamber 3. A working surface 7 is defined by the upper opening of the container 5, wherein the working surface 7 is preferably implemented as a working plane. The area of the working surface 7 located within the opening, which can be used for building the object 2, is referred to as build area 8.

In the container 5, a support 10 is arranged that can be moved in a vertical direction V and to which a base plate 11 is attached which seals the container 5 at the bottom and thus forms the bottom thereof. The base plate 11 can be formed as a plate separately from the support 10 which plate is fixed to the support 10, or it can be integrally formed with the support 10. Depending on the powder and process used, a building platform 12 can also be arranged on the base plate 11 on which the object 2 is built. However, the object 2 can also be built on the base plate 11 itself, which then serves as a building platform. In FIG. 1, the object 2 to be formed in the container 5 on the building platform 12 is shown below the working surface 7 in an intermediate state with several solidified layers, surrounded by building material 13 that remained unsolidified.

The laser sintering device 1 further comprises a storage container 14 for a building material 15 that can be solidified by electromagnetic radiation and an application device 16 that can be moved in a horizontal direction H for applying the building material 15 to the build area 8.

Furthermore, a radiation source 21 is arranged in the process chamber 3 that is described below in more detail with reference to FIG. 3. The radiation source 21 generates electromagnetic radiation 22 that is suited to cause solidification of the building material 15 at those positions of a layer of the building material applied in the build area 8 that correspond to the cross-section of the object to be produced when the radiation is incident on those positions. An exposure optics 20 is arranged in the beam path of the radiation 22, which exposure optics focuses the radiation 22 to the build area 8 and thus generates a demagnified rescaled image of the radiation source 21 in the build area 8, the radiation source serving as the object to be imaged to the build area.

For this purpose, the exposure optics 20 comprises at least a first lens 23 (see FIG. 4 and FIG. 5) that is arranged on the object side, i.e. facing the radiation source 21, and a second lens 24 (see FIG. 4 and FIG. 6) that is arranged on the image side, i.e. facing the build area 8. In this case, on the object side or object-sided refers to the radiation source as the object to be imaged and not to the three-dimensional object to be produced by the device.

The exposure optics 20 is designed and arranged in the beam path of the radiation 22 such that the electromagnetic radiation 22 is incident on the working surface 7 substantially perpendicular, as described in more detail below with reference to FIGS. 4-6. The exposure optics 20 itself and the lenses 23, 24 are also described in more detail below with reference to FIGS. 4-6.

Furthermore, the laser sintering device 1 comprises a control unit 29 by which the individual components of the device 1 can be controlled in a coordinated manner in order to implement the building process. The control unit can also be arranged partly or completely outside the device. The control unit can comprise a CPU, the operation of which is controlled by a computer program (software). The computer program can be stored separately from the device on a storage medium from which it can be loaded into the device, in particular into the control unit.

Figure 2:
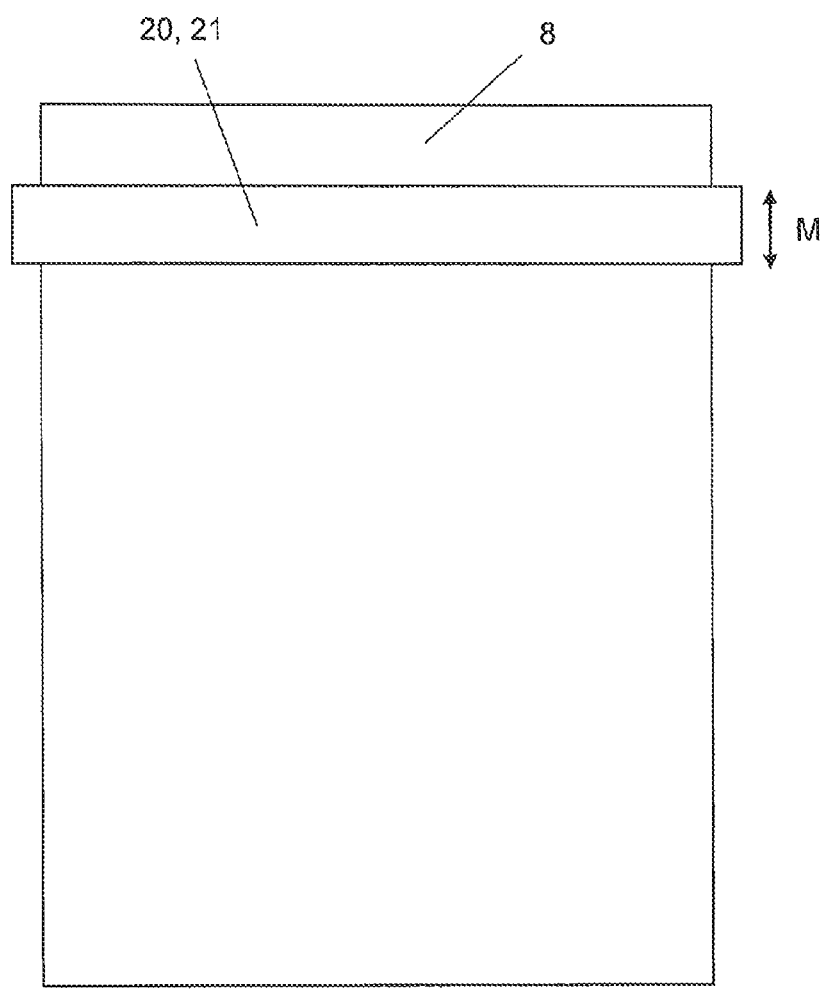
FIG. 2 shows a schematic view of the device shown in FIG. 1 from above.

FIG. 2 shows a schematic view of the laser sintering device or laser melting device 1 from above, showing the radiation source 21 and the exposure optics 20 that are arranged so as to be movable over the build area 8 in a horizontal direction M. The radiation source 21 and the exposure optics 20 can be moved preferably as an entity. The radiation source 21 and the exposure optics 20 are configured and arranged in the device 1 such that the selective solidification of a layer of the building material 15 in the build area 8 is implemented by the unit comprised of the radiation source 21 and the exposure optics 20 moving once or several times in the direction M, i.e. across the length of the build area 8.

Figure 3:
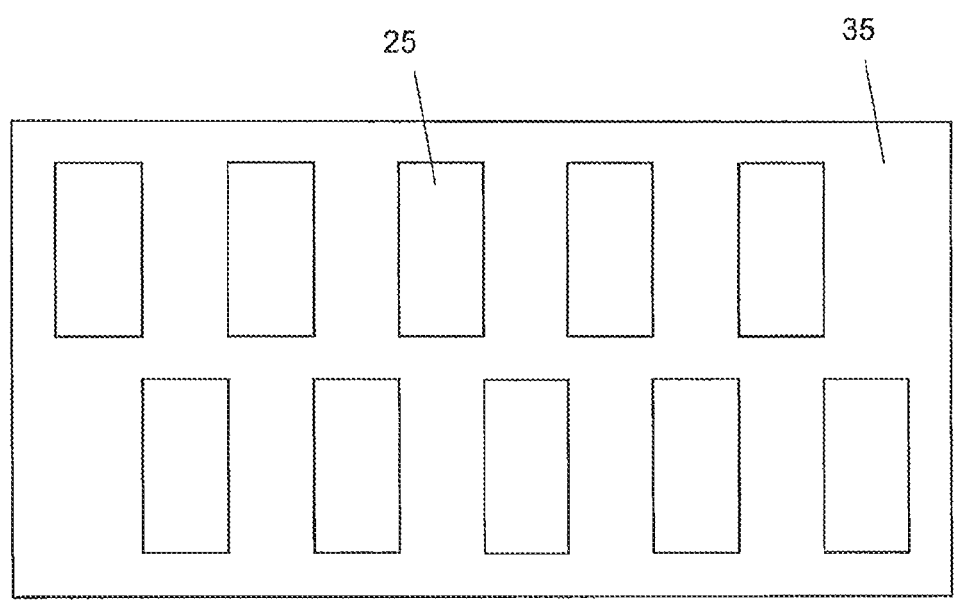
FIG. 3 shows a schematic view, in cross-section, of the laser module shown in FIG. 1.

The radiation source 21 is designed as a laser module 35, as shown in FIG. 3. The laser module 35 comprises lasers grouped in laser arrays 25, which lasers are preferably designed as semiconductor lasers, in particular as semiconductor laser diodes, more preferably as vertical cavity surface emitting lasers (VCSEL) or as vertical external cavity surface emitting lasers (VECSEL).

The lasers and the exposure optics 20 are designed and arranged such that at least one laser, preferably at least two lasers of a laser array 25 irradiate one pixel in the working surface 7 at a point in time. A pixel is defined as the smallest area element that can be irradiated in the work surface 7. Further preferred, the laser light of an entire laser array 25 is imaged to a pixel in the working surface 7.

Figure 4:
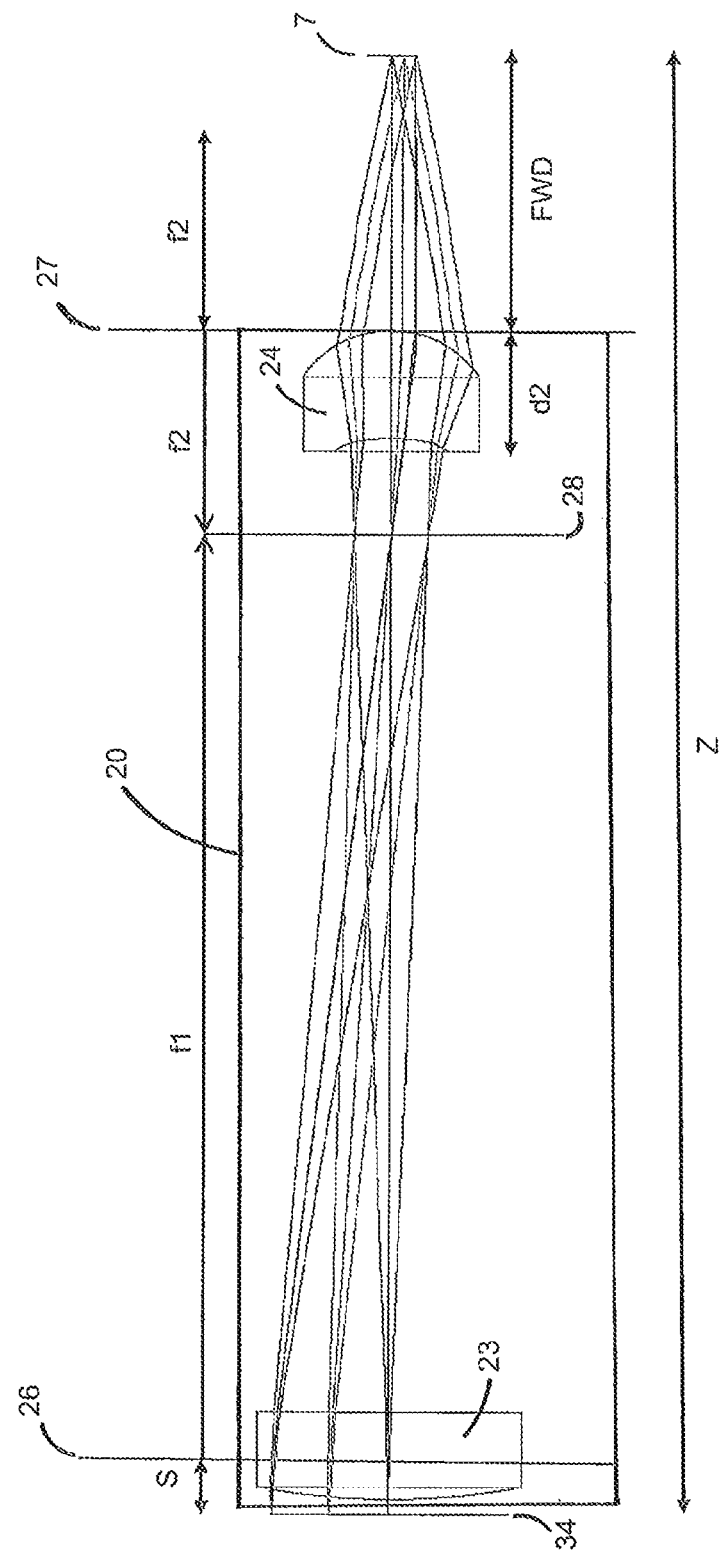
FIG. 4 shows a schematic view of an arrangement of the lenses and of the beam paths of an exposure optics used in the device.

FIG. 4 shows the arrangement of the lenses 23, 24 in the exposure optics 20. The object plane 34 (the plane of the object to be imaged) is defined by the plane in which the lasers of the module 35 emit laser light. The object-sided first lens 23 is arranged close to the object plane 34 in the beam path of the radiation 22 and has a first principal plane 26 and a first focal length $f_1$. As can be seen in FIGS. 4 and 5, the first lens 23 has a spherical, convex surface 30 facing the object plane 34 and a planar surface 31 facing away from the object plane. The first lens 23 is adapted to focus the central rays of parallel incident light beams (cones of light) in the focal plane 28, which focal plane is located at a distance $f_1$ to the principal plane 26 of the first lens 23, i.e. the first lens is a converging lens. The image-sided numerical aperture of the first lens 23 is preferably smaller than 0.25, more preferably smaller than 0.15. Thus, a good resolution of the radiation 22 to be imaged is achieved.

The second lens 24 is arranged at a distance from the first lens 23 in the beam path of the radiation 22. It has a second principal plane 27 and a second focal length $f_2$. The second principal plane is arranged at a working distance (free working distance FWD) to the working surface 7.

Figure 6:
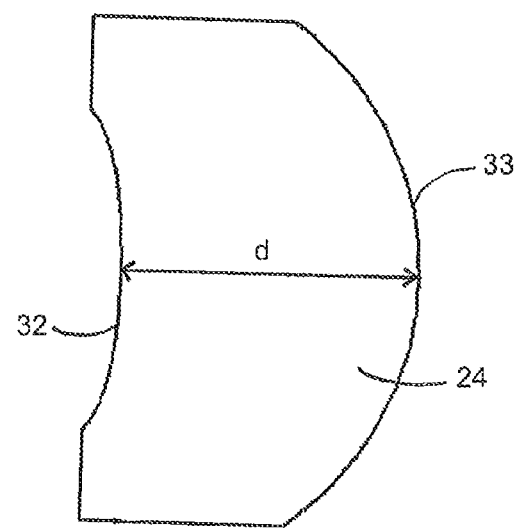
FIG. 6 shows a schematic view, in cross-section, of the second lens of FIG. 4.
Figure 7:
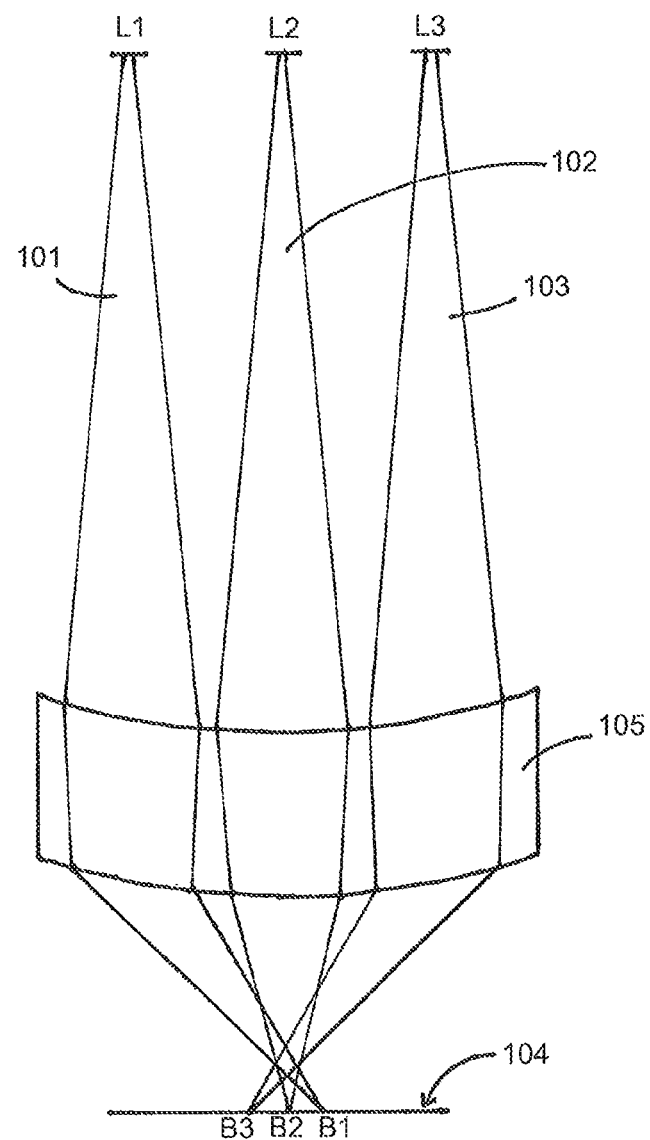
FIG. 7 shows a schematic view of an arrangement of a lens and of the beam paths of an exposure optics used in the prior art.

As can be seen in FIGS. 4 and 6, the second lens 24 has an aspheric surface 32 facing the first lens 23 and a spherical surface 33 facing the working surface 7. The spherical surface 33 is convex and its radius of curvature R applies:

$$R < f_2 \cdot (n-1),$$

wherein n is the refractive index of the lens material of the lens 24 so that the focal length of the spherical surface 33 alone is smaller than the total focal length $f_2$ of the lens 24.

The aspheric surface 32 is concave with a large, negative focal length. The center thickness d between the aspheric surface 32 and the spherical surface 33 is greater than a quarter, preferably greater than half the focal length $f_2$. As a result, the principal plane 27 of the lens 23 is located close to the spherical surface 33 and the aspheric surface 32 is located between the principal plane 27 and the focal plane 28. The aspheric surface can thus be used well in order to reduce optical aberrations, such as optical distortion and field curvature.

The lenses 23, 24 are arranged in the beam path of the radiation 22 in such a way that their focal planes coincide in a common plane 28. To obtain a demagnified image of the radiation emitted by the radiation source 21 in the working surface 7, the lenses 23, 24 are selected so that their focal lengths $f_1$ and $f_2$ apply:

$$f_1 > f_2.$$

The demagnification scale is given by the quotient $f_2/f_1$ and is at least 0.05, preferably at least 0.1 and particularly preferred at least 0.15 and/or at most 1, preferably at most 0.5 and particularly preferred at most 0.3. The demagnified imaging causes a smaller pixel size and a larger energy input per area element in the working surface 7.

The focal length $f_2$ of the second lens 24 is to be chosen such that $$f_2 < FWD,$$

wherein FWD denotes the free working distance.

The total distance Z between the object plane 34 and the working surface 7 is calculated as $$Z \approx s + f_1 + 2 \cdot f_2,$$

wherein s denotes the distance between the object plane 34 and the principal plane 26 of the first lens 23 and can be chosen to be very small. For example, s can be about 1 mm.

With an exposure optics designed and arranged as described, one can achieve that the electromagnetic radiation 22 is incident on the working surface 7 substantially perpendicular. This means that a telecentric imaging of the laser elements of the modules to the working surface is implemented, wherein each beam cone coming from a laser element is focused to a pixel of the working surface such that the central axes of the light cone focused to the working surface is substantially perpendicular to the working surface irrespective of the distance of the laser element from the optical axis of the exposure optics.

Hereafter, the operation of the laser sintering device or laser melting device 1 described above is described. For applying a layer of the building material 15, the support 10 is first lowered by an amount that corresponds to the desired layer thickness. Then, a layer of the building material 15 is applied by moving the application device 16 over the working surface 7. Application takes place at least over the entire cross-section of the object 2 to be produced, preferably over the entire build area 8, i.e. that region of the working surface 7 that can be lowered by a vertical movement of the support.

Subsequently, the cross-section of the object 2 to be produced is selectively irradiated with laser radiation 22 so that the building material 15 in powder form is solidified at those positions that correspond to the cross-section of the object 2 to be produced.

For this purpose, each pixel to be exposed is irradiated by at least one laser, preferably by at least two lasers, preferably by an entire laser array 25, at a point in time. While doing so, the radiation source 21 and the exposure optics 20 move in the direction M across the build area 8 and the lasers of the radiation source 21 are switched according to the positions to be solidified.

By doing so, the radiation acts on all positions of the layer that are to be solidified in such a way that the powder grains are partially or completely melted at these positions by the heat introduced by the radiation so that they are present joint together as a solid after cooling.

The steps of applying a layer of the building material 15 and of selectively solidifying are repeated until the object 2 is completed and can be removed from the building space.

The radiation source described with reference to FIG. 1 and FIG. 3 is designed as a laser module. In an alternative embodiment, the radiation source comprises at least two laser modules, wherein preferably an exposure optics is assigned to each module. Furthermore, the modules can be arranged to be cascaded and/or overlapping.

Figure 5:
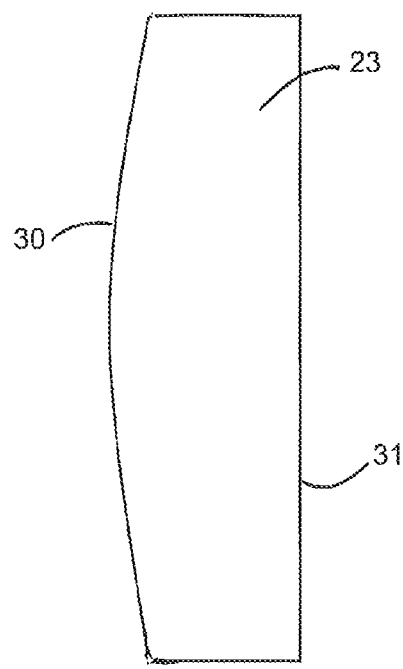
FIG. 5 shows a schematic view, in cross-section, of the first lens of FIG. 4.

The first lens 23 shown in FIGS. 4 and 5 comprises a spherical surface 30 and a planar surface 31. Alternatively, the lens 23 can also have two spherical, preferably convex, surfaces.

The exposure optics described above comprises two lenses. However, further optical elements can also be provided for imaging the radiation emitted by the radiation source to the working surface. Furthermore, the first lens and/or the second lens can also be designed as a lens system, i.e. formed by at least two separate lenses.

The radiation source can alternatively also be arranged outside the process chamber. In this case, the process chamber has a window at its top for coupling in the radiation. Furthermore, the exposure optics can also be arranged outside the process chamber.

In addition, a radiation heater can also be provided above the working surface for heating the surface of the layer of the building material to be solidified to a working temperature. Alternatively, it is also possible to use lasers that are not used for irradiating for preheating and, for example, to operate these lasers with reduced power.

Although the present invention was described by means of a laser sintering device or laser melting device it is not limited to laser sintering or laser melting. The invention can be applied to any methods of producing a three-dimensional object by applying, layer by layer, and selectively solidifying a building material in powder form by means of electromagnetic radiation.

Preferably, a material in powder form is used as building material that is suitable for forming a joint structure under the influence of electromagnetic radiation. For this purpose, various kinds of powders can be used, in particular plastic powders, metal powders, ceramic powders, sand, filled or mixed powders.

The invention claimed is:

1. An exposure optics as an equipping and/or retrofitting optics for a device for producing a three-dimensional object by selectively solidifying building material, layer by layer, at positions that correspond to a cross-section of the object to be produced in the respective layer by electromagnetic radiation, wherein the device comprises a radiation source capable of emitting the electromagnetic radiation in a plurality of beams each of which is suited to cause solidification of the building material at positions of a layer of the building material applied in a working surface of the device, the positions corresponding to the cross-section of the object to be produced, when impinging on the positions, the exposure optics comprising:

at least a first beam source facing lens system having a first focal length $f_1$ and a second working surface facing lens system having a second focal length $f_2$, the lens systems being arranged in the beam paths of the radiation emitted by the radiation source, the beam paths being in a straight linear array between the lens systems, the focal plane of the first lens system and the focal plane of the second lens system coinciding in a plane between the two lens systems; and the focal length $f_1$ of the first lens system is equal to or greater than the focal length $f_2$ of the second lens system, and the beams from the working surface sided lens system are focused to impinge substantially perpendicular on the working surface.

2. A device for producing a three-dimensional object by selectively solidifying building material, layer by layer, at positions that correspond to a cross-section of the object to be produced in the respective layer by electromagnetic radiation, comprising:

a radiation source capable of emitting electromagnetic radiation that is suited to cause solidification of the building material at positions of a layer of the building material applied in a working surface of the device, the positions corresponding to the cross-section of the object to be produced, when impinging on those positions; and an exposure optics having at least a first object-sided lens system having a first focal length $f_1$ and a second image-sided lens system having a second focal length $f_2$, the lens systems being arranged in a beam path of the radiation emitted by the radiation source, wherein the focal plane of the first lens system and the focal plane of the second lens system coincide in a plane between the two lens systems;

wherein the focal length $f_1$ of the first lens system is equal to or greater than the focal length $f_2$ of the second lens system;

wherein the exposure optics is designed and arranged so that the electromagnetic radiation is incident substantially perpendicular on the working surface; and wherein the radiation source and the exposure optics are movable across the working surface to selectively solidify a layer of the building material applied in the working surface.

3. The device according to claim 2, wherein the radiation source is formed by lasers which are grouped as modules.

4. The device according to claim 2, wherein the exposure optics is movably arranged in a process chamber of the device.

5. The device according to claim 2, wherein the focal length $f_2$ of the second lens system is smaller than a minimum free working distance (FWD).

6. The device according to claim 2, wherein the radiation source and/or a further exposure optics arranged between the radiation source and the exposure optics are configured such that the radiation is incident on the first lens system substantially perpendicular.

7. The device according to claim 3, wherein the lasers are VCSELs.

8. The device according to claim 3, wherein each module comprises at least two laser arrays.

9. The device according to claim 2, wherein the second lens system of the exposure optics comprises at least two curved surfaces, and wherein at least one of the curved surfaces is aspheric.

10. The device according to claim 2, wherein the second lens system of the exposure optics comprises at least two curved surfaces and a minimum distance and/or a center thickness between the two surfaces is greater than a quarter of the focal length $f_2$.

11. The device according to claim 2, wherein the second lens system of the exposure optics comprises at least two curved surfaces, wherein at least one of the curved surfaces is spherical and for whose radius of curvature R applies:

$$R < f_2 \cdot (n-1)$$

wherein $f_2$ is the focal length of the second lens system and n is a refractive index of the lens material.

12. The device according to claim 2, wherein the first lens system of the exposure optics comprises two spherical surfaces or a planar and a spherical surface.

13. The device according to claim 2, wherein the quotient $f_2/f_1$ corresponds to a selected magnification or demagnification scale.

14. The device according to claim 2, wherein a quotient $f_2/f_1$ has a value of at least 0.05.

15. The device according to claim 2, wherein at least one of the two lens systems of the exposure optics is formed by a single lens.

16. The device according to claim 2, wherein at least one of the lens systems of the exposure optics is composed of at least two lenses.

17. The device according to claim 1, wherein the radiation source and the exposure optics are integrated into a unit which moves both the radiation source and the exposure optics together across the working surface in use.

18. The device according to claim 1, wherein the radiation source is comprised of multiple laser beams, each of which is individually controlled to generate at least one laser beam focused to a spot on the working surface.

19. The device according to claim 18, wherein the radiation source is further comprised of multiple VCSEL modules, each module having a plurality of laser arrays.

* * * * *